United States Patent [19]
Liu et al.

[11] Patent Number: 6,166,581
[45] Date of Patent: Dec. 26, 2000

[54] DIFFERENTIAL INTEGRATOR HAVING OFFSET AND GAIN COMPENSATION, NOT REQUIRING BALANCED INPUTS

[75] Inventors: Liusheng Liu; Lee Tay Chew, both of Singapore, Singapore

[73] Assignee: Tritech Microelectronics, Ltd., Singapore, Singapore

[21] Appl. No.: 09/210,701

[22] Filed: Dec. 14, 1998

[51] Int. Cl.[7] ........................................... G06F 7/64
[52] U.S. Cl. ............................... 327/337; 327/554
[58] Field of Search ........................... 327/554, 337, 327/95, 96; 330/9

[56] References Cited

U.S. PATENT DOCUMENTS

| | | | |
|---|---|---|---|
| 4,647,865 | 3/1987 | Westwick | 330/51 |
| 4,746,871 | 5/1988 | de la Plaza | 327/337 |
| 4,896,156 | 1/1990 | Garverick | 341/143 |
| 4,988,900 | 1/1991 | Fensch | 327/337 |
| 5,220,286 | 6/1993 | Nadeem | 330/9 |
| 5,410,270 | 4/1995 | Rybicki et al. | 330/9 |
| 5,736,895 | 4/1998 | Yu et al. | 327/554 |
| 5,739,720 | 4/1998 | Lee | 330/9 |

OTHER PUBLICATIONS

K. Nagaraj et al; Switched –Capacitor Circuits with Reduced Sensitivity to Amplifier Gain, IEEE Transactions on Circuits and Systems, vol. CAS–34, pp. 571–574, May 1987.

*Primary Examiner*—Kenneth B. Wells
*Assistant Examiner*—Linh Nguyen
*Attorney, Agent, or Firm*—George O. Saile; Stephen B. Ackerman

[57] ABSTRACT

Disclosed is a fully differential switched-capacitor integrator which accepts a single-ended or unbalanced input signal and compensates the offset and finite gain of the operational amplifier without an extra converter circuit. The proposed circuit utilizes a special input structure which adds special capacitors to store the offset and the low frequency noise of the operational amplifier. One preferred embodiment implements the switching means as transmission gates using CMOS transistors. Clock feedthrough is prevented by providing two non-overlapping clock phases with a delayed clock each, thus avoiding clock feed-through. The invention provides a good alternative for applications such as low noise filters and sigma delta modulators.

26 Claims, 5 Drawing Sheets

DIFFERENTIAL INTEGRATOR HAVING OFFSET AND GAIN COMPENSATION, NOT REQUIRING BALANCED INPUTS

BACKGROUND OF THE INVENTION

1. Field of the Invention

The invention relates to an electronic integrator circuit, and more particularly to a fully differential switched-capacitor integrator for use in low noise filters and sigma delta modulators.

2. Description of the Related Art

Fully differential circuits are more attractive in high performance, high precision applications for their two advantages a) they are less sensitive to power supply noise and b) they are capable of achieving a dynamic range which is approximately twice that of single-ended circuits. However, fully differential circuits usually just accept well balanced differential input signals. Therefore, a single-ended to differential converter circuit is needed in front of it. This increases the complexity of the system and adds extra noise as well.

There are few related art circuits which convert a single-ended signal to a differential signal by themselves without an extra converter circuit.

U.S. Pat. No. 4,647,865 (Westwick) proposes a switched capacitor input structure for a fully differential amplifier, which can accept single-ended signals. But the offset and low frequency noise of the amplifier do not cancel. This is not acceptable in some high performance applications.

U.S. Pat. No. 5,410,270 (Rybicki et al.) a fully differential amplifier having offset cancellation is proposed. However, this circuit can only be used as an amplifier, it cannot change to an integrator, which is widely used in filter circuits and other applications.

U.S. Pat. No. 4,896,156 (Garverick et al.) proposes a three phase system which complicates the timing and system design.

U.S. Pat. No. 5,220,286 (Nadeem) discloses a single-ended to differential input converter which is more complex than the circuit of the invention and cannot compensate the offset and finite operational amplifier gain either.

U.S. Pat. No. 4,746,871 (de la Plaza) describes a differential switched capacitor integrator but which requires two operational amplifiers and does not appear to accept single-ended inputs.

It should be noted that none of the above-cited examples of the related art provide a fully differential switched-capacitor integrator that could accept single-ended or unbalanced input signals and compensates the offset and finite gain of the operational amplifier at the same time.

SUMMARY OF THE INVENTION

It is an object of the present invention to provide a fully differential switched-capacitor integrator which accepts a single-ended or unbalanced input signal and compensates the offset and finite gain of the operational amplifier without an extra converter circuit.

Another object of the present invention is to provide a good alternative circuit for applications such as low noise and sigma delta modulators.

A further object of the present invention is to avoid clock feed-through.

These objects have been achieved by utilizing a special input structure and by adding special capacitors to store the offset and the low frequency noise of the operational amplifier. The switching means can be implemented as transistors, p-channel or n-channel transistors, or as transmission gates using CMOS transistors. Clock feedthrough is prevented by providing two non-overlapping clock phases with a delayed clock each.

DESCRIPTION OF THE PREFERRED EMBODIMENT

The present invention proposes a new kind of fully differential switched-capacitor integrator, which utilizes a special input structure to accept, in addition to a fully differential input signal, a single-ended or unbalanced input signal and adds two extra capacitors to compensate the offset and finite gain of the operational amplifier. Please refer to K. Nagaraj, T. Viswanathan, K. Singhal, and J. Vlach, "Switched-Capacitor Circuits with Reduced Sensitivity to Amplifier Gain." *IEEE TRANSACTIONS ON CIRCUITS AND SYSTEMS.*, vol. CAS-34, pp 571–574, May 1987. The present invention is a good alternative for some applications, such as low noise filters and sigma delta modulators.

Figure 1:
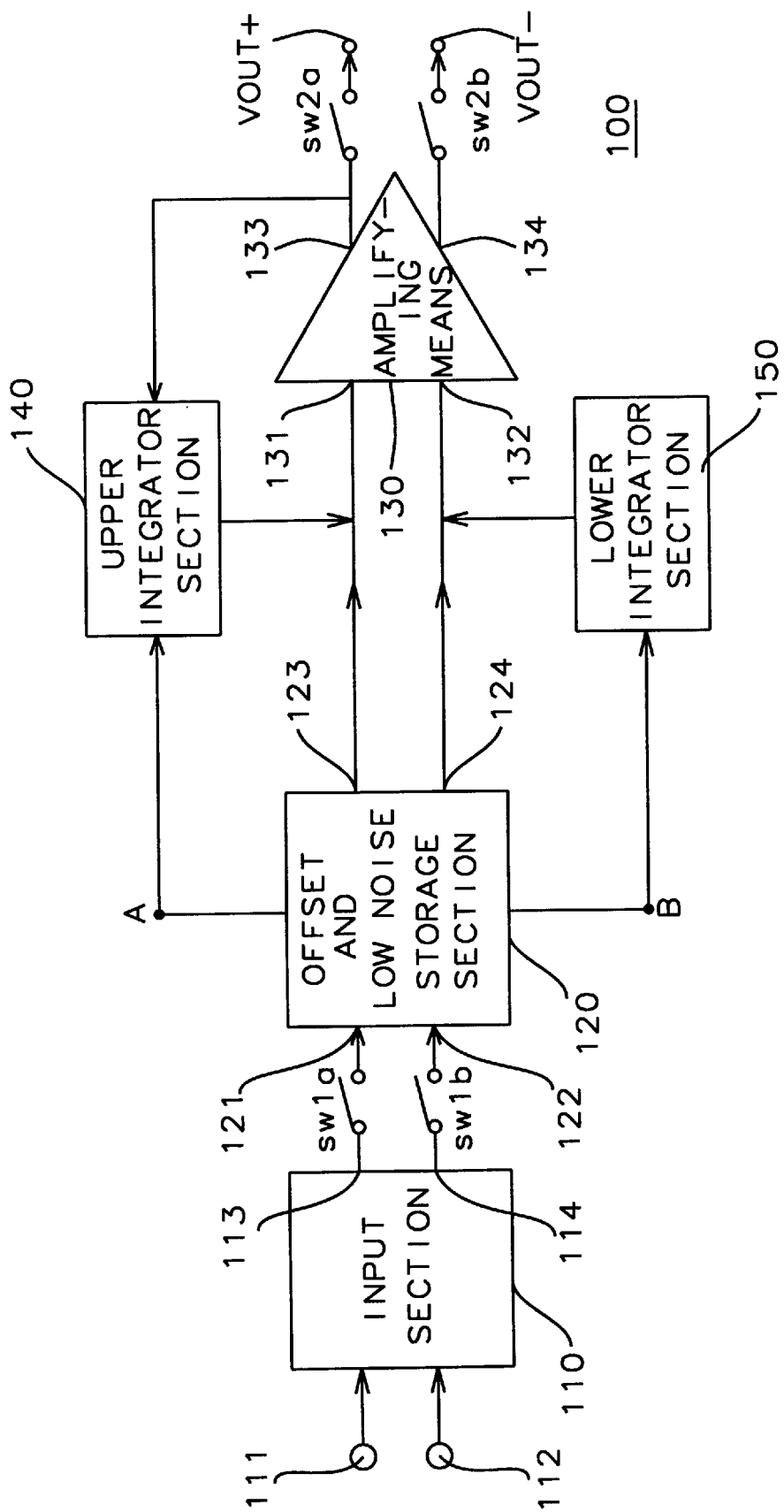
FIG. 1 is a high level block diagram of the present invention.

Referring now to FIG. 1, we describe a block diagram of the preferred embodiment of the invention. The differential integrator circuit 100 is comprised of blocks 110, 120, 130, 140, and 150. Input section 110 has inputs 111 and 112 and outputs 113 and 114, the input section accepting a fully differential input signal through switching means during a first period of time, and outputs 113 and 114 providing output signals. Input section 110 also accepts a single ended input signal or an unbalanced input signal which is converted to a differential signal with offset cancellation.

Offset and low noise storage section 120 has inputs 121 and 122, terminals A and B, and outputs 123 and 124. Inputs 121 and 122 are connected, through switching means sw1a and sw1b during a second period of time, to outputs 113 and 114, respectively. Block 120 is used to store a signal offset and a low frequency noise signal and compensates for the offset of Block 130. Block 120 also compensates for the finite gain of Block 130.

Amplifying means 130 has inputs 131 and 132 and outputs 133 and 134, where inputs 131 and 132 connect to outputs 123 and 124, respectively. Outputs 133 and 134 are connected, through switching means sw2a and sw2b during a first period of time, to output VOUT+ and output VOUT−, respectively.

Upper integrator section 140 is connected between input 131 and output 133 of Block 130 through switching means during a first period of time, and is connected to terminal A through switching means during a second period of time.

Lower integrator section 150 is connected between input 132 and output 134 of Block 130 through switching means during a first period of time, and is connected to terminal B through switching means during a second period of time.

A desirable characteristic of the present invention is that outputs VOUT+ and VOUT− do not relate to the input common-mode voltage $V_{IC}$ applied to inputs 111 and 112 of input section 110. In addition the circuit is insensitive to the gain of amplifying means (Block 130).

Figure 2:
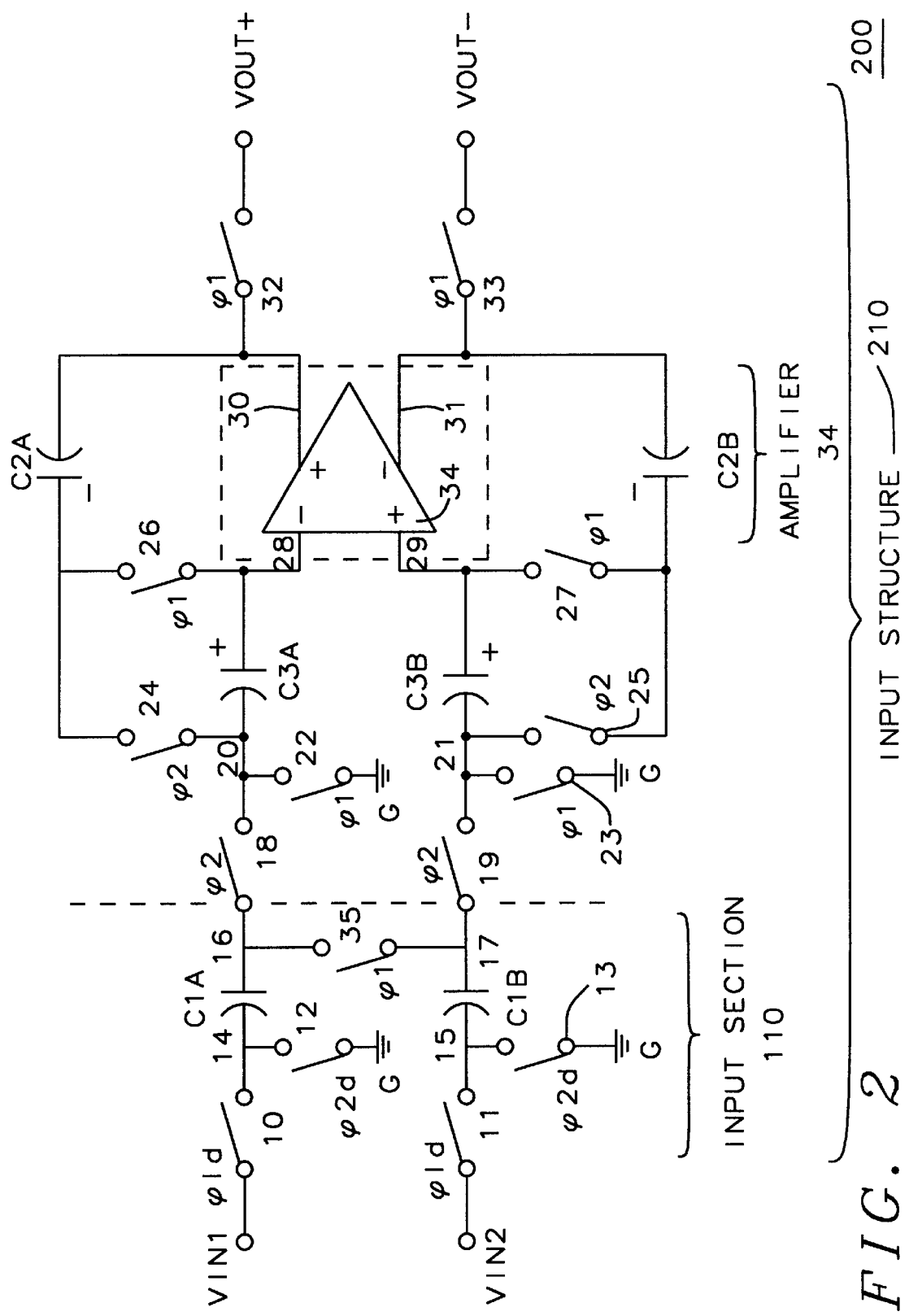
FIG. 2 is a circuit diagram of the present invention.

Referring now to FIG. 2, capacitors C1A and C1B, switches 10–13 and 35 comprise the input section 110 (see also FIG. 1) of the preferred embodiment of the invention, which accepts a single-ended or unbalanced input signal. Capacitors C3A and C3B (Block 120 of FIG. 1) are used to store the offset and low frequency noise of the operational amplifier 34. C2A and C2B (Blocks 140 and 150 of FIG. 1) are integration capacitors.

Again referring to FIG. 2, we now provide a more detailed description of the theory of operation of the invention. When phase 1 (φ1) is active, switches 10, 11, and 35 turn on, and switches 12, 13, 18, and 19 turn off. The input section 110 is then disconnected from the rest of the integrator. C1A and C1B are connected in series, forming a voltage divider. Signals VIN1 and VIN2 can each be considered as comprising common-mode voltage $V_{IC}$ and differential-mode voltage $V_{ID}$ components as defined by solving the following equations:

$$VIN1(n)=V_{IC}(n)+0.5V_{ID}(n) \quad (1)$$

$$VIN2(n)=V_{IC}(n)-0.5V_{ID}(n) \quad (2)$$

where n stands for that instant in time. Usually, C1A=C1B=C1, C2A=C2B=C2, C3A=C3B=C3, then the potential at nodes 16 and 17 is $V_{IC}(n)$, and the voltage across C1A and C1B is $0.5V_{ID}(n)$ and $-0.5V_{ID}(n)$, respectively.

At the same time switches 22, 23, 26, and 27 are closed. Nodes 20 and 21 are connected to ground, or reference potential, through switches 22 and 23, respectively. Thus, C3A and C3B are charged to the offset voltage ($V_{OS}$) of the operational amplifier 34. For simplicity, infinite operational amplifier gain and constant offset voltage are assumed. Then the voltage of the operational amplifier negative input terminal 28 is $-0.5V_{OS}$, the voltage of the operational amplifier positive input terminal 29 is $0.5V_{OS}$. Therefore, the voltage across capacitors C3A and C3B is $-0.5V_{OS}$ and $0.5V_{OS}$, respectively, and the voltage across C2A and C2B is $V^1_{OUT+}(n-1)+0.5V_{OS}$ and $V^1_{OUT-}(n-1)-0.5V_{OS}$, respectively, where the superscript 1 stands for the value at the end of φ1.

In summary, the voltage across each capacitor at the end of φ1 is listed below:

C1A: $+0.5V_{ID}(n)$
C1B: $-0.5V_{ID}(n)$
C2A: $V^1_{OUT+}(n-1)+0.5V_{OS}$
C2B: $V^1_{OUT-}(n-1)-0.5V_{OS}$
C3A: $-0.5V_{OS}$
C3B: $+0.5V_{OS}$

When phase 2 (φ2) is active, C1A and C1B are disconnected from the input and nodes 14 and 15 are shorted to ground through switches 12 and 13. Switches 18, 19, 24, and 25 are closed. Therefore, C2A and C1A join together at node 20, C2B and C1B join together at node 21. Charges stored in C1A and C1B during φ1 are transferred to C2A and C2B. Assuming the voltages at nodes 20 and 21 at the end of φ2 are $V_{XA}$ and $V_{XB}$, respectively, then the voltage across each capacitor is:

C1A: $-V_{XA}$
C1B: $-V_{XB}$
C2A: $V^2_{OUT+}(n)-V_{XA}$
C2B: $V^2_{OUT-}(n)-V_{XB}$
C3A: $-0.5V_{OS}-V_{XA}$
C3B: $+0.5V_{OS}-V_{XB}$ where the superscript 2 stands for the value at the end of φ2.

Because the right (+) plate of capacitors C3A and C3B is always connected to the input terminals of the operational amplifier, the charges on C3A and C3B remain unchanged from φ1 to φ2, thus:

$$C3A●(-0.5V_{OS}-V_{XA})=C3A●(-0.5V_{OS}) \quad (3)$$

$$C3B●(+0.5V_{OS}-V_{XB})=C3B●(+0.5V_{OS}) \quad (4)$$

which results in $V_{XA}=V_{XB}=0$. This means that nodes 20 and 21 are shorted to ground during φ1 and become virtual ground during φ2. The voltages across each capacitor can be rewritten as follows:

C1A: 0
C1B: 0
C2A: $V^2_{OUT+}(n)$
C2B: $V^2_{OUT-}(n)$
C3A: $-0.5V_{OS}$
C3B: $+0.5V_{OS}$

Utilizing the charge conservation law at nodes 20 and 21:

$$C1A[0-0.5V_{ID}(n)]=-C2A\{V^2_{OUT+}(n)-[V^1_{OUT+}(n-1)+0.5V_{OS}]\} \quad (5)$$

$$C1B[0+0.5V_{ID}(n)]=-C2B\{V^2_{OUT-}(n)-[V^1_{OUT-}(n-1)-0.5V_{OS}]\} \quad (6)$$

where the "0" in the first square bracket of eq.'s (5) and (6) is the voltage of C1A and C1B during φ2, respectively, and where the second term of the first square bracket is the voltage of C1A and C1B during φ1, respectively.

Solving these two equations the following results are obtained:

$$V^2_{OUT+}(n)=V^1_{OUT+}(n-1)+(C1/C2)·(0.5V_{ID})+0.5V_{OS} \quad (7)$$

$$V^2_{OUT-}(n)=V^1_{OUT-}(n-1)-(C1/C2)·(0.5V_{ID})-0.5V_{OS} \quad (8)$$

where $(C1/C2)(0.5V_{ID})$ is the integration part and $0.5V_{OS}$ is the offset part.

Therefore, the integration is finished. But the output is contaminated by the offset.

Next φ2 becomes inactive and φ1 becomes active again. As before, C1A and C1B are charged to the new input voltage, C3A and C3B are charged to the operational amplifier offset. The left (−) plate of C2A is connected to the operational amplifier negative (−) input terminal instead of node 20, the left (−) plate of C2B is connected to the operational amplifier positive (+) input terminal instead of node 21. No charge transfer occurred during this procedure. So:

$$C2A●[V^1_{OUT+}(n)+0.5V_{OS}]=C2A●V^2_{OUT+}(n) \quad (9)$$

$$C2B●[V^1_{OUT-}(n)-0.5V_{OS}]=C2B●V^2_{OUT-}(n) \quad (10)$$

Substituting eq. (7)

$$V^1_{OUT+}(n)=V^2_{OUT+}(n)-0.5V_{OS}=V^1_{OUT+}(n-1)+(C1/C2)·(0.5V_{ID}) \quad (11)$$

Substituting eq. (8)

$$V^1_{OUT\_}(n) = V^2_{OUT\_}(n) + 0.5V_{OS} = V^1_{OUT\_}(n-1) - (C1/C2) \cdot (0.5V_{ID}) \quad (12)$$

The offset is cancelled. Also, the outputs do not relate to the input common-mode voltage $V_{IC}$. This manifests the object of the invention that a balanced input signal is not required. When the input is a single-ended signal the invention converts the single-ended signal to a differential signal with offset cancellation.

Detailed analysis carried out in the previously recited reference shows that the proposed circuit is insensitive to the gain of the operational amplifier. This characteristic relaxes the operational amplifier design.

All the switches are con trolled by two non-overlapping clocks φ1 and φ2. Switches 10 and 11 are controlled by φ1 delayed (φ1d) which is a delayed signal of clock φ1. Switches 12 and 13 are controlled by φ2 delayed (φ2d) which is a delayed signal of clock φ2. Delayed clocks are introduced for the sake of reducing clock feedthrough. Switches 18, 19, and 24, 25 are controlled by clock φ2. Switches 22, 23, 26, 27, 32, 33, and 35 are controlled by clock φ1.

Referring once more to FIG. 2, we describe in more detail the differential integrator circuit 200 of the present invention having offset and gain compensation and comprising an amplifier 34 and an input structure 210.

Amplifier 34 has a minus (−) input, a plus (+) input, a +output 30, and a −output 31, the amplifier provides a signal with gain at the + and −output.

Input structure 210 has a first and a second input VIN1 and VIN2 and outputs 28 and 29; input structure 210 accepts a first and a second input signal at inputs VIN1 and VIN2, respectively. Output 28 of input structure 210 is connected to the −input of amplifier 34, and output 29 of input structure 210 is connected to the + input of amplifier 34, where input structure 210 converts a single ended input signal to a differential signal at outputs 28 and 29.

Input structure 210 further comprises:

a φ1d switching means 10 connected with one end to input VIN1, a φ1d switching means 11 connected with one end to input VIN2, a φ2d switching means 12 serially connected between the other end of φ1d switching means 10 and a reference potential G (typically ground), a φ2d switching means 13 serially connected between the other end of φ1d switching means 11 and reference potential G, a capacitor C1A connected with one plate to the other end of φ1d switching means 10, a capacitor C1B connected with one plate to the other end of φ1d switching means 11, a φ2 switching means 18 connected with one end to the other plate of capacitor C1A, a φ2 switching means 19 connected with one end to the other plate of capacitor C1B, a φ1 switching means 22 serially connected between the other end of φ2 switching means 18 and reference potential G, a φ1 switching means 23 serially connected between the other end of φ2 switching means 19 and reference potential G, a capacitor C3A connected with one plate to the other end of φ2 switching means 18, the other plate of capacitor C3A connected to the − input of amplifier 34, a capacitor C3B connected with one plate to the other end of φ2 switching means 19, the other plate of capacitor C3B connected to the + input of amplifier 34, a φ2 switching means 24 connected with one end to the other end of φ2 switching means 18, a φ2 switching means 25 connected with one end to the other end of φ2 switching means 19, a φ1 switching means 26 serially connected between the other end of φ2 switching means 24 and the − input of amplifier 34, a φ1 switching means 27 serially connected between the other end of φ2 switching means 25 and the + input of amplifier 34, a capacitor C2A connected with one plate to the other end of φ2 switching means 24, the other plate of capacitor C2A connected to the + output 30 of amplifier 34, a capacitor C2B connected with one plate to the other end of φ2 switching means 25, the other plate of capacitor C2B connected to the − output 31 of amplifier 34, a φ1 switching means 32 serially connected between the + output 30 of amplifier 34 and output terminal VOUT+, a φ1 switching means 33 serially connected between the −output 31 of amplifier 34 and output terminal VOUT−, and a φ1 switching means 35 serially connected between the other plate of capacitor C1A and the other plate of capacitor C1B.

All φ1 switching means are activated by a clock φ1, and all φ1d switching means are activated by a delayed clock φ1. All φ2 switching means are activated by a clock φ2, and all φ2d switching means are activated by a delayed clock φ2.

Figure 3:
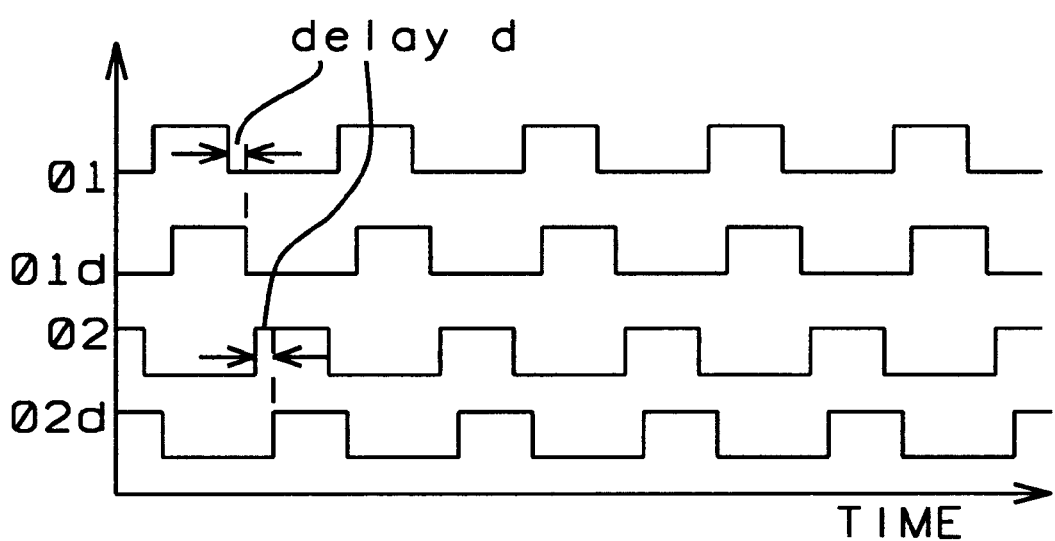
FIG. 3 is a timing diagram illustrating the timing phases of the circuit of FIG. 2.

Referring now to FIG. 3, four clocks are used, labeled φ1, φ1d, φ2, and φ2d. It can be seen that clocks φ2 and φ2d are non-overlapping with respect to clock φ1 and clock φ1d.

Switching means may be implemented in many ways like transistors or, more typically, p-channel or n-channel metal oxide (MOS) transistors. A preferred embodiment of the present invention makes use of transmission gates employing p-channel and n-channel MOS transistors as shown in FIG. 4, and described next.

Figure 4:
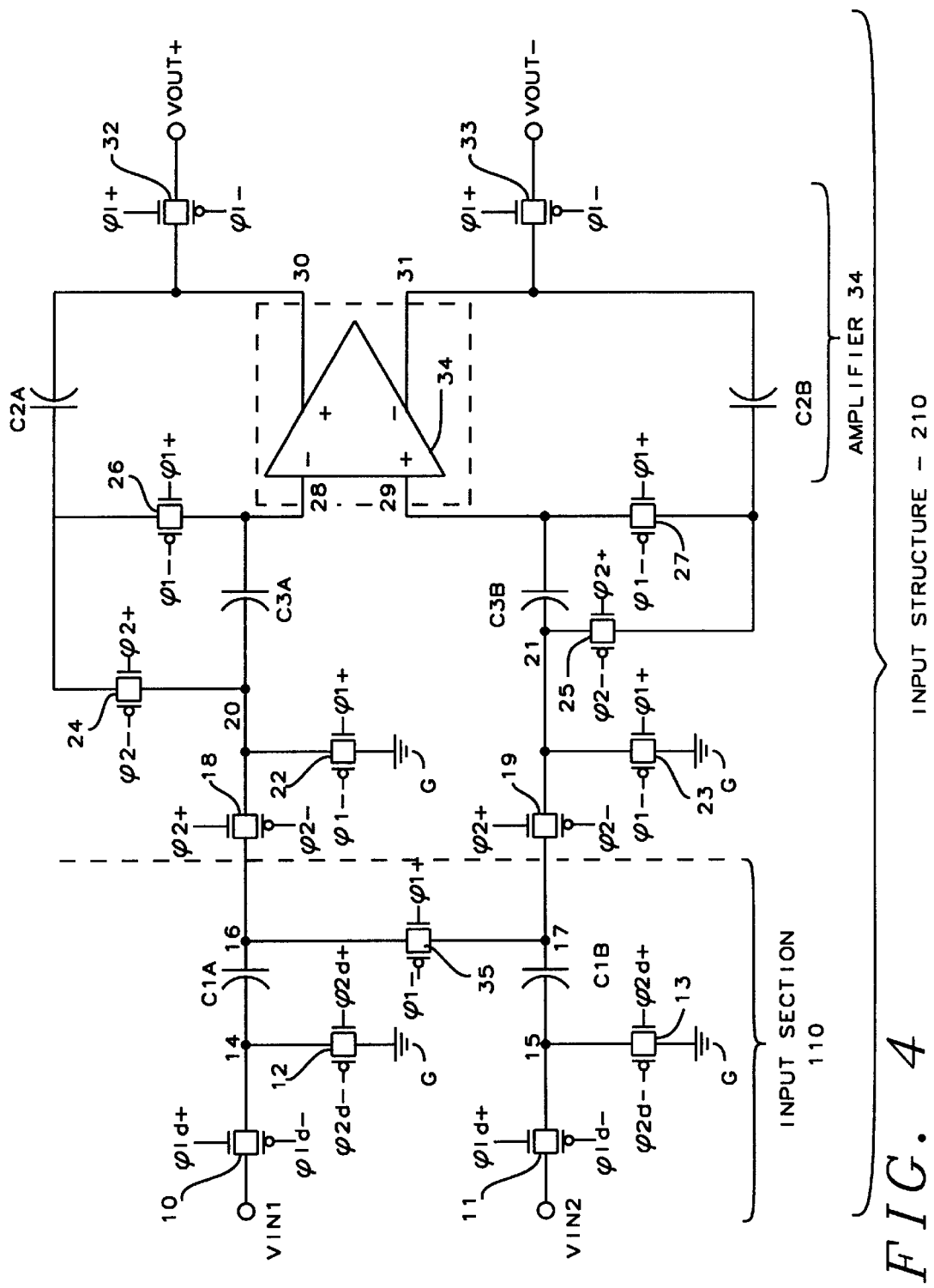
FIG. 4 is a circuit diagram showing another preferred embodiment of the present invention using transmission gates.

The circuit of FIG. 4 is essentially the same as that of circuit of FIG. 2, except for the substitution of transmission gates for the switching means of FIG. 2. Similar elements of FIGS. 2 and 4 have the same reference characters. In FIG. 4 the transmission gates replace the switching means of FIG. 2. In FIG. 4, switches 10–13, 18, 19, 22–27, 32, 33, and 35 are transmission gates with the p-channel and n-channel transistor of each transmission gate connected in parallel.

Figure 5:
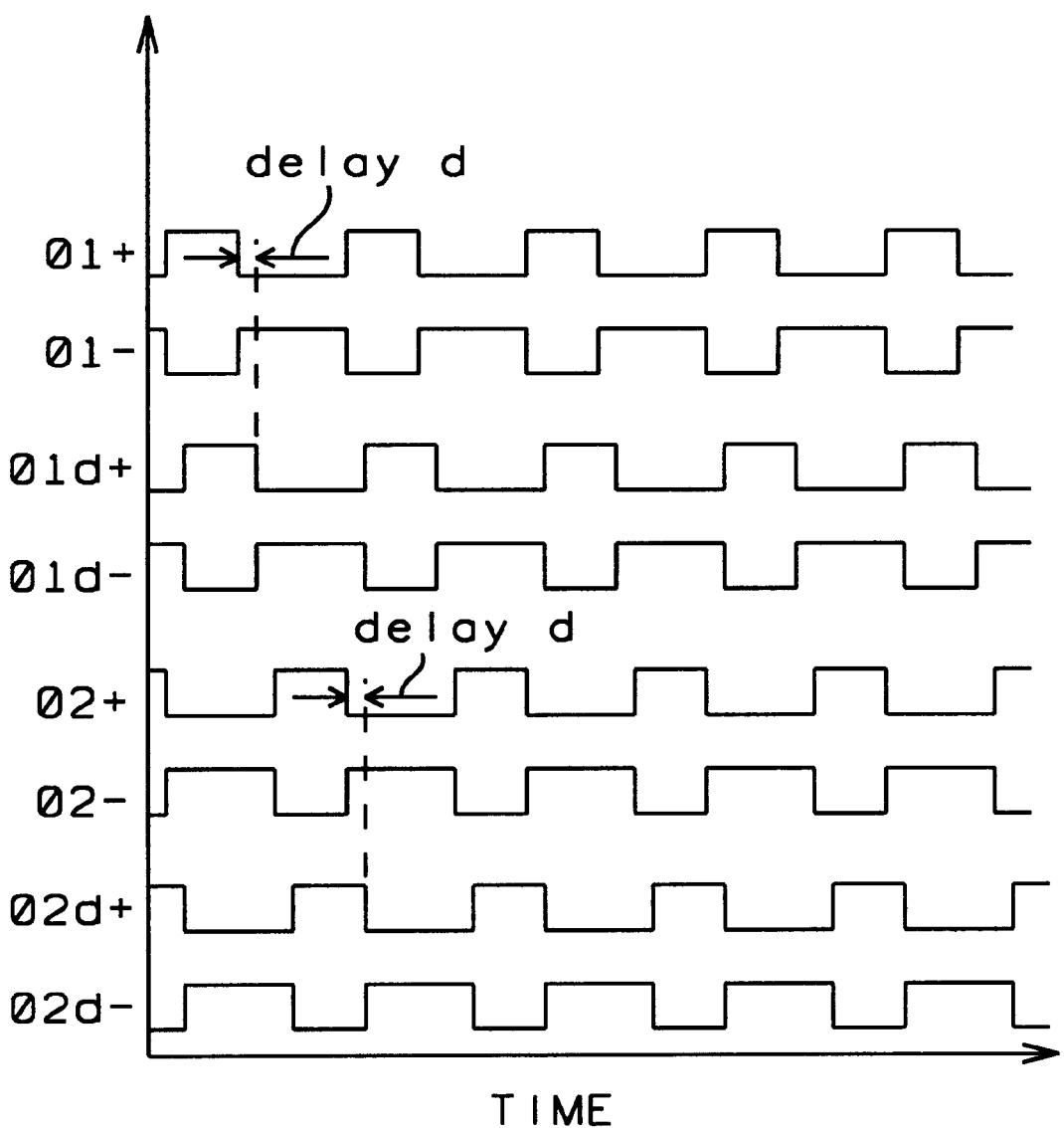
FIG. 5 is a timing diagram illustrating the timing phases of the circuit of FIG. 4.

Referring now to FIG. 5, we describe the timing diagram for the circuit of FIG. 4. Eight clocks are used, where φ1, φ1d, φ2, and φ2d of FIG. 4 are identical to those of FIG. 2 with the same designation. Added to FIG. 4 are the inverses (180° out-of-phase, electrically) of each of the four clocks φ1, φ1d, φ2, and φ2d. These eight clocks have the suffix "+" or "−" added, to indicate to which transistor gate, n-channel or p-channel, each clock goes to.

Summarizing the clocks as shown in FIG. 5:

1) gates of each n-channel transistor and each p-channel transistor of a φ1 transmission gate are activated by a positive clock φ1+ and by a negative clock φ1−, respectively.

2) gates of each n-channel transistor and each p-channel transistor of a φ1d transmission gate are activated by a delayed positive clock φ1d+ and by a delayed negative clock φ1d−, respectively.

3) gates of each n-channel transistor and each p-channel transistor of a φ2 transmission gate are activated by a positive clock φ2+ and by a negative clock φ2−, respectively.

4) gates of each n-channel transistor and each p-channel transistor of a φ2d transmission gate are activated by a delayed positive clock φ2d+ and by a delayed negative clock φ2d−, respectively.

Similar to the clocks of FIG. 3, the timing diagram of FIG. 5 shows that both phases (+ and −) of clocks φ2 and φ2d are non-overlapping with respect to both phases (+ and −) of clocks φ1 and φ1d.

The invention just described offers the advantages of a new kind of fully differential switched-capacitor integrator which:

utilizes a special input structure to accept a single-ended or unbalanced input signal, compensates the offset and finite gain of the operational amplifier or amplifying means, provides a good alternative for applications such as low noise and sigma delta modulators, avoids clock feed-through by providing two non-overlapping clock phases with a delayed clock each, implements switching means as transistors, p-channel or n-channel transistors, or as transmission gates using CMOS transistors.

While the invention has been particularly shown and described with reference to the preferred embodiments thereof, it will be understood by those skilled in the art that various changes in form and details may be made without departing from the spirit and scope of the invention.

What is claimed is:

1. A differential integrator circuit, comprising:

an input section having a first and a second input and a first and second output, said input section accepting a fully differential input signal through first and second switching means during a first period of time, said first and said second output providing a first and a second output signal, said input section further comprising:

a first capacitive means connected serially between said first switching means and said first output;

a second capacitive means connected serially between said second switching means and said second output;

a third switching means of said first period of time connected between said first and said second output of said input section, said third switching means thereby connecting serially said first and said second capacitive means to form a voltage divider when said third switching means is closed;

an offset and low noise storage section having a first and a second input, and a first and a second output, said first and said second input of said offset and low frequency noise section connected, through a third and a fourth switching means during a second period of time, to said first and said second output of said input section, respectively, said offset and low frequency noise section used to store an offset and a low frequency noise signal of an amplifying means, said offset and low noise storage section further comprising:

a third capacitive means connected serially between said third switching means and said first output of said offset and low noise storage section, said third capacitive means storing said offset and low frequency noise signal;

a fourth capacitive means connected serially between said fourth switching means and said second output of said offset and low noise storage section, said fourth capacitive means storing said offset and low frequency noise signal;

said amplifying means with a first and a second input and a first and a second output, said first and said second input of said amplifying means connected to said first and said second output of said offset and low frequency noise section, respectively, said outputs of said amplifying means connected, through switching means during a first period of time, to an output VOUT+ and an output VOUT−, respectively;

an upper integrator section connected between said first input and said first output of said amplifying means through switching means during a first period of time, and connected to said first input of said offset and low noise storage section through switching means during a second period of time; and a lower integrator section connected between said second input and said second output of said amplifying means through switching means during a first period of time, and connected to said second input of said offset and low noise storage section through switching means during a second period of time.

2. The circuit of claim 1, wherein by means of said voltage divider said input section accepts a single ended input signal.

3. The circuit of claim 2, wherein by means of said voltage divider said single ended input signal is converted to a differential signal with offset cancellation.

4. The circuit of claim 1, wherein by means of said voltage divider said input section accepts an unbalanced signal input.

5. The circuit of claim 4, wherein by means of said voltage divider said unbalanced input signal is converted to a differential signal with offset cancellation.

6. The circuit of claim 1, wherein said offset and low frequency noise section compensates for the offset of said amplifying means.

7. The circuit of claim 1, wherein said offset and low frequency noise section compensates for the finite gain of said amplifying means.

8. The circuit of claim 1, wherein said outputs VOUT+ and VOUT− do not relate to an input common-mode voltage applied to said first and second input of said input section.

9. The circuit of claim 1, wherein said differential integrator is insensitive to the gain of said amplifying means.

10. The circuit of claim 1, wherein said differential integrator is a switched capacitor integrator.

11. A differential integrator circuit having offset and gain compensation, comprising:

an amplifier having a minus and a plus input, and a plus and a minus output, said amplifier providing a signal with gain at said plus and minus output;

an input structure having a first and a second input and a first and second output, said input structure accepting a first and a second input signal at said first and second input, respectively, said first output of said input structure connected to said minus input of said amplifier, and said second output of said input structure connected to said plus input of said amplifier, said input structure converting a single ended input signal to a differential signal at said first and second output of said input structure;

said input structure further comprising:

a first φ1d (where φ=phase) switching means connected with one end to said first input of said input structure;

a second φ1d switching means connected with one end to said second input of said input structure;

a first φ2d switching means serially connected between the other end of said first φ1d switching means and to a reference potential;

a second φ2d switching means serially connected between the other end of said second φ1d switching means and said reference potential;

a first capacitor connected with one plate to the other end of said first φ1d switching means;

a second capacitor connected with one plate to the other end of said second φ1d switching means;

a first φ2 switching means connected with one end to the other plate of said first capacitor;

a second φ2 switching means connected with one end to the other plate of said second capacitor;

a first φ1 switching means serially connected between the other end of said first φ2 switching means and said reference potential;

a second φ1 switching means serially connected between the other end of said second φ2 switching means and said reference potential;

a third capacitor connected with one plate to the other end of said first φ2 switching means, the other plate of said third capacitor connected to said minus input of said amplifier;

a fourth capacitor connected with one plate to the other end of said second φ2 switching means, the other plate of said fourth capacitor connected to said plus input of said amplifier;

a third φ2 switching means connected with one end to the other end of said first φ2 switching means;

a fourth φ2 switching means connected with one end to the other end of said second φ2 switching means;

a third φ1 switching means serially connected between the other end of said third φ2 switching means and said minus input of said amplifier;

a fourth φ1 switching means serially connected between the other end of said fourth φ2 switching means and said plus input of said amplifier;

a fifth capacitor connected with one plate to said other end of said third φ2 switching means, the other plate of said fifth capacitor connected to said plus output of said amplifier;

a sixth capacitor connected with one plate to said other end of said fourth φ2 switching means, the other plate of said sixth capacitor connected to said minus output of said amplifier;

a fifth φ1 switching means serially connected between said plus output of said amplifier and a first output terminal;

a sixth φ1 switching means serially connected between said minus output of said amplifier and a second output terminal; and a seventh φ1 switching means serially connected between the other plate of said first capacitor and the other plate of said second capacitor.

12. The circuit of claim 11, wherein said φ1 switching means are activated by a clock φ1.

13. The circuit of claim 11, wherein said φ1d switching means are activated by a delayed clock φ1.

14. The circuit of claim 11, wherein said φ2 switching means are activated by a clock φ2.

15. The circuit of claim 11, wherein said φ2d switching means are activated by a delayed clock φ2.

16. The circuit of claim 14, wherein said clock φ2 is non-overlapping with respect to said clock φ1.

17. The circuit of claim 15, wherein said delayed clock φ2 is non-overlapping with respect to said delayed clock φ1.

18. The circuit of claim 11, wherein said switching means are transistors.

19. A differential integrator circuit having offset and gain compensation, comprising:

an amplifier having a minus and a plus input, and a plus and a minus output, said amplifier providing a signal with gain at said plus and minus output;

an input structure having a first and a second input and a first and second output, said input structure accepting a first and a second input signal at said first and second input, respectively, said first output of said input structure connected to said minus input of said amplifier, and said second output of said input structure connected to said plus input of said amplifier, said input structure converting a single ended input signal to a differential signal at said first and second output of said input structure;

said input structure further comprising:

a first φ1d transmission gate connected with one end to said first input of said input structure;

a second φ1d transmission gate connected with one end to said second input of said input structure;

a first φ2d transmission gate serially connected between the other end of said first φ1d transmission gate and a reference potential;

a second φ2d transmission gate serially connected between the other end of said second φ1d transmission gate and said reference potential;

a first capacitor connected with one plate to the other end of said first φ1d transmission gate;

a second capacitor connected with one plate to the other end of said second φ1d transmission gate;

a first φ2 transmission gate connected with one end to the other plate of said first capacitor;

a second φ2 transmission gate connected with one end to the other plate of said second capacitor;

a first φ1 transmission gate serially connected between the other end of said first φ2 transmission gate and said reference potential;

a second φ1 transmission gate serially connected between the other end of said second φ2 transmission gate and said reference potential;

a third capacitor connected with one plate to the other end of said first φ2 transmission gate, the other plate of said third capacitor connected to said minus input of said amplifier;

a fourth capacitor connected with one plate to the other end of said second φ2 transmission gate, the other plate of said fourth capacitor connected to said plus input of said amplifier;

a third φ2 transmission gate connected with one end to the other end of said first φ2 transmission gate;

a fourth φ2 transmission gate connected with one end to the other end of said second φ2 transmission gate;

a third φ1 transmission gate serially connected between the other end of said third φ2 transmission gate and said minus input of said amplifier;

a fourth φ1 transmission gate serially connected between the other end of said fourth φ2 transmission gate and said plus input of said amplifier;

a fifth capacitor connected with one plate to said other end of said third φ2 transmission gate, the other plate of said fifth capacitor connected to said plus output of said amplifier;

a sixth capacitor connected with one plate to said other end of said fourth φ2 transmission gate, the other plate of said sixth capacitor connected to said minus output of said amplifier;

a fifth φ1 transmission gate serially connected between said plus output of said amplifier and a first output terminal;

a sixth φ1 transmission gate serially connected between said minus output of said amplifier and a second output terminal;

a seventh φ1 transmission gate serially connected between the other plate of said first capacitor and the other plate of said second capacitor;

means for controlling said φ1 and φ1d transmission gates during a first period of time through a clock φ1; and means for controlling said φ2 and φ2d transmission gates during a second period of time through a clock φ2 subsequent to said first period of time.

20. The circuit of claim 19, wherein each of said transmission gates is comprised of an n-channel transistor and a p-channel transistor connected in parallel with said n-channel transistor.

21. The circuit of claim 20, wherein gates of each of said n-channel transistors and each of said p-channel transistors of said φ1 transmission gates are activated by a positive clock φ1 and by a negative clock φ1, respectively.

22. The circuit of claim 21, wherein said gates of each of said n-channel transistors and each of said p-channel transistors of said φ1d transmission gates are activated by a positive, delayed clock φ1 and by a negative, delayed clock φ1, respectively.

23. The circuit of claim 21, wherein said gates of each of said n-channel transistors and each of said p-channel transistors of said φ2 transmission gates are activated by a positive clock φ2 and by a negative clock φ2, respectively.

24. The circuit of claim 21, wherein said gates of each of said n-channel transistors and each of said p-channel transistors of said φ2d transmission gates are activated by a positive, delayed clock φ2 and by a negative, delayed clock φ2, respectively.

25. The circuit of claim 23, wherein said clocks φ2 are non-overlapping with respect to said clocks φ1.

26. The circuit of claim 24, wherein said delayed clocks φ2 are non-overlapping with respect to said delayed clocks φ1.

* * * * *